United States Patent [19]
Lorentz et al.

[11] Patent Number: 5,306,405
[45] Date of Patent: Apr. 26, 1994

[54] SPUTTERING TARGET AND METHOD OF MANUFACTURE

[75] Inventors: Robert D. Lorentz, North Oaks; Joseph H. Sexton, Oakdale, both of Minn.

[73] Assignee: Minnesota Mining and Manufacturing Company, St. Paul, Minn.

[21] Appl. No.: 904,997

[22] Filed: Jun. 26, 1992

[51] Int. Cl.$^5$ .................. C23C 14/46; H01L 39/24
[52] U.S. Cl. .................. 204/192.11; 204/192.12; 204/192.24; 204/298.12; 204/298.13; 264/86; 427/372.2; 505/731; 505/816
[58] Field of Search .................. 204/192.11–192.12, 204/192.15, 192.24, 298.12, 298.13; 427/372.2, 189–190; 264/131, 86; 505/731, 816

[56] References Cited

U.S. PATENT DOCUMENTS

| | | | |
|---|---|---|---|
| 3,879,278 | 4/1975 | Grosewald et al. | 204/192.15 |
| 4,049,523 | 9/1977 | Boehnke et al. | 204/192.12 |
| 4,416,755 | 11/1983 | Ceasar et al. | 204/192.11 |
| 5,091,221 | 2/1992 | Chu et al. | 427/282 |
| 5,135,629 | 8/1992 | Sawada et al. | 204/192.12 |
| 5,160,675 | 11/1997 | Iwamoto et al. | 264/56 |

FOREIGN PATENT DOCUMENTS

| | | |
|---|---|---|
| 0288010 | 10/1988 | European Pat. Off. |
| 53-99082 | 8/1978 | Japan . |
| 63-83257 | 4/1988 | Japan . |
| 63-262208 | 10/1988 | Japan . |
| 2-267262 | 11/1990 | Japan .................. 204/298.13 |

OTHER PUBLICATIONS

"A New High-$T_c$ Oxide Superconductor without a Rare Earth Element", Hiroshi Maeda, Yoshiaki Tanaka, Masao Fukutomi and Toshihisa Asano, *Japanese Journal of Applied Physics*, vol. 27, No. 2, Feb. 1988, pp. L209-L210.

"Superconductivity in the High-$T_c$ Bi-Ca-Sr-Cu-O System: Phase Identification", R. M. Hazen, et al., *Physical Review Letters*, vol. 60, No. 12, Mar. 12, 1988, pp. 1174-1177.

"Two-Dimensional Superstructure in the (001) Plane of $Bi_2[Ca,Sr]_3Cu_2O_{8+\delta}$ Thin Films", A. F. Marshall et al., *American Institute of Physics*, Appl. Phys. Lett. 63(5), Aug. 1, 1988, pp. 426-428.

"Superconductivity in Thin Films of the Bi-Ca-Sr-Cu-O System", J. H. Kang, R. T. Kampwirth, K. E. Gray, S. March and E. A. Huff, *Physics Letters A*, vol. 128, No. 1.2, Mar. 21, 1988, pp. 102-104.

"Superconducting Oxide Thin Films by Ion Beam Sputtering", P. H. Kobrin, J. F. DeNatale, R. M. Housley, J. F. Flintoff and A. B. Harker, *Advanced Ceramic Materials* vol. 2, No. 3B, Special Issue, 1987, pp. 430-435.

"Oriented High-Temperature Superconducting Bi-Sr-Ca-Cu-O Thin Films Prepared by Ion Beam Deposition", Robert D. Lorentz and J. H. Sexton, *American Institute of Physics*, Appl. Phys. Lett. 53, Oct. 24, 1988, pp. 1654-1656.

"Reactive Ion Beam Deposition of Thin Films in the Bismuth-Calcium-Strontium-Copper Oxide Ceramin Superconductor System", A. B. Harker, P. H. Kobrin, P. E. D. Morgan, J. F. DeNatale, J. J. Ratto, I. S. Gergis and D. G. Howitt, *American Institute of Physics*, Appl. Phys. Lett. 52(25), Jun. 20, 1988, pp. 2186-2187.

"Sputter Deposition of Y-Ba-Cu-O Superconducting Thin Films from an Oxide Powder Target", J. Argana, R. C. Rath, A. M. Kadin and P. H. Ballentine, American Vacuum Society Topical Conference on High Temperature Superconductors, Anaheim, Calif., Nov. 6, 1987.

*Primary Examiner*—Aaron Weisstuch
*Attorney, Agent, or Firm*—Gary L. Griswold; Walter N. Kirn; Eric D. Levinson

[57] ABSTRACT

A method for preparing a slurry target for use in a sputtering apparatus. The target material is ground into a powder form, and mixed with a solvent to form a slurry. The slurry is poured into a target mold and allowed to slow dry by evaporation at or near room temperature. The target is mechanically stable, can be positioned in any orientation without falling out of the mold, and resists failure from thermal stresses during sputtering.

9 Claims, 3 Drawing Sheets

SPUTTERING TARGET AND METHOD OF MANUFACTURE

BACKGROUND OF THE INVENTION

Sputtering is one of several well known techniques for applying or depositing a layer on a substrate. Generally, the substrate is placed in a deposition chamber which is evacuated or pressurized to a desired pressure. A particle flux of the coating material is generated within the chamber and the coating or deposition occurs by condensation of the particle flux onto the substrate surface.

In the ion beam bombardment sputtering technique, a high-energy source beam of ions is directed toward the target. The force of the bombarding ions imparts sufficient energy to the atoms of the target to cause the energized atoms to leave the target and form a particle flux. The resulting deposition upon a substrate forms a thin film.

Sputtering targets may be, for example, solid metallic blocks of a selected element or alloy. For sputtering of ceramic materials, targets may be dry powders made into a unitary porous structure. Other dry powder targets may be prepared by mixing the materials to be deposited into a binder-solvent slurry, casting the slurry into a mold, and applying heat to drive off the solvent and cure the binder. Such targets are prone to impurities (from the binder), frequent cracking from thermally-induced stresses, blistering (from embedded gasses), and difficulty in repairing targets damaged during the sputtering operation.

SUMMARY OF THE INVENTION

The invention comprises a method of manufacturing a target for sputter deposition of a coating onto a substrate. The method includes providing a powdered target material, and combining a suspending liquid with the target material to form a slurry. The slurry is then formed into a desired target shape, and the slurry is dried by evaporating the suspending liquid.

The invention also comprises another method of manufacturing a target for sputter deposition of a coating onto a substrate. The method includes providing a powdered target material having powder particles of mixed sizes, and combining a suspending liquid with the target material to form a slurry. The slurry is then formed into a desired target shape, and the slurry is dried by evaporating the suspending liquid. The evaporation occurs at ambient temperature in order to produce a target which retains the desired target shape when positioned at an angle to the horizontal within a sputtering system.

The invention comprises yet another method of manufacturing a target for sputter deposition of a coating onto a substrate. The method includes providing a powdered target material having powder particles of mixed sizes, and combining a suspending liquid with the target material to form a slurry. The slurry is then formed into a desired target shape, and the suspending liquid is permitted to evaporate at a regulated rate in order to achieve slow drying of the slurry.

The invention comprises a still another method of manufacturing a target for sputter deposition of coatings onto one or more substrates. The method includes providing a powdered target material having powder particles of mixed sizes, and combining a suspending liquid with the target material to form a slurry. The slurry is then formed into a desired target shape, and the suspending liquid is then evaporated to produce a target which yields compositional consistency in the resulting coatings.

The invention also comprises a method of applying a coating onto a substrate. The method includes providing a powdered target material, and combining a suspending liquid with the target material to form a slurry. The slurry is then formed into a desired target shape, and the suspending liquid is evaporated in a regulated manner to achieve slow drying of the slurry. Then, the target material is sputter deposited onto a substrate.

The invention comprises a method of manufacturing a target for sputter deposition of a plurality of consecutive and compositionally consistent coatings onto a substrate. The method includes providing a powdered target material having powder particles of mixed sizes ranging up to about 1 millimeter, and combining a suspending liquid with the target material to form a slurry. Then, the slurry is formed into a desired target shape, and the suspending liquid is evaporated in a regulated manner to achieve slow drying of the slurry.

DETAILED DESCRIPTION OF THE INVENTION

Ion beam deposition methods are used to produce various superconducting films. Typically, a focused beam of ions is directed toward a single target of the material to be sputtered. Problems arise in this type of process, however, since the incident ion beam typically has a Gaussian profile and ions in the tail of this distribution may sputter material from the vacuum chamber walls or from around the target holder. This can lead to contamination of the deposited film. In order to avoid this, large targets are often used. However, use of a large target has drawbacks.

For example, pressed Y-Ba-Cu-O powder targets were used in early attempts to fabricate high temperature superconducting Y-Ba-Cu-O thin films. Such targets were made by pressing powder, ground from Y-Ba-Cu-O pellets, into copper target molds. Approximately 1000 psi ($6.72 \times 10^3$ kPa) was applied during the pressing process. However, these targets were not mechanically reliable because the pressed powder often fell out of the target mold if jarred during handling. Installation of such targets inside the vacuum chamber was therefore difficult, because the target rested at an angle, commonly a 45° angle, from the vertical. For those targets which survived handling and installation, gases trapped in the powder increased the pumpdown time of the system. In addition, the expansion of the trapped gasses during chamber evacuation occasionally disrupted the powder and caused a catastrophic slide out of the target mold.

Monolithic sintered targets were also fabricated. Due to the large (typically 7.5 inch/19 centimeters) diameter of the targets, significant quantities of material were needed and a large furnace was necessary for the firing of the target. Sintered targets of this size frequently cracked from thermally-induced stresses during target firing as well as during sputtering. Therefore, new processes were still necessary.

Co-pending U.S. patent application Ser. No. 07/904,835 filed Jun. 26, 1992 titled SPUTTERING SHIELDS AND METHOD OF MANUFACTURE discloses uses of a target material slurry similar to the slurry disclosed below, but used in novel and non-obvious applications relative to this disclosure or any prior reference.

Figure 1:
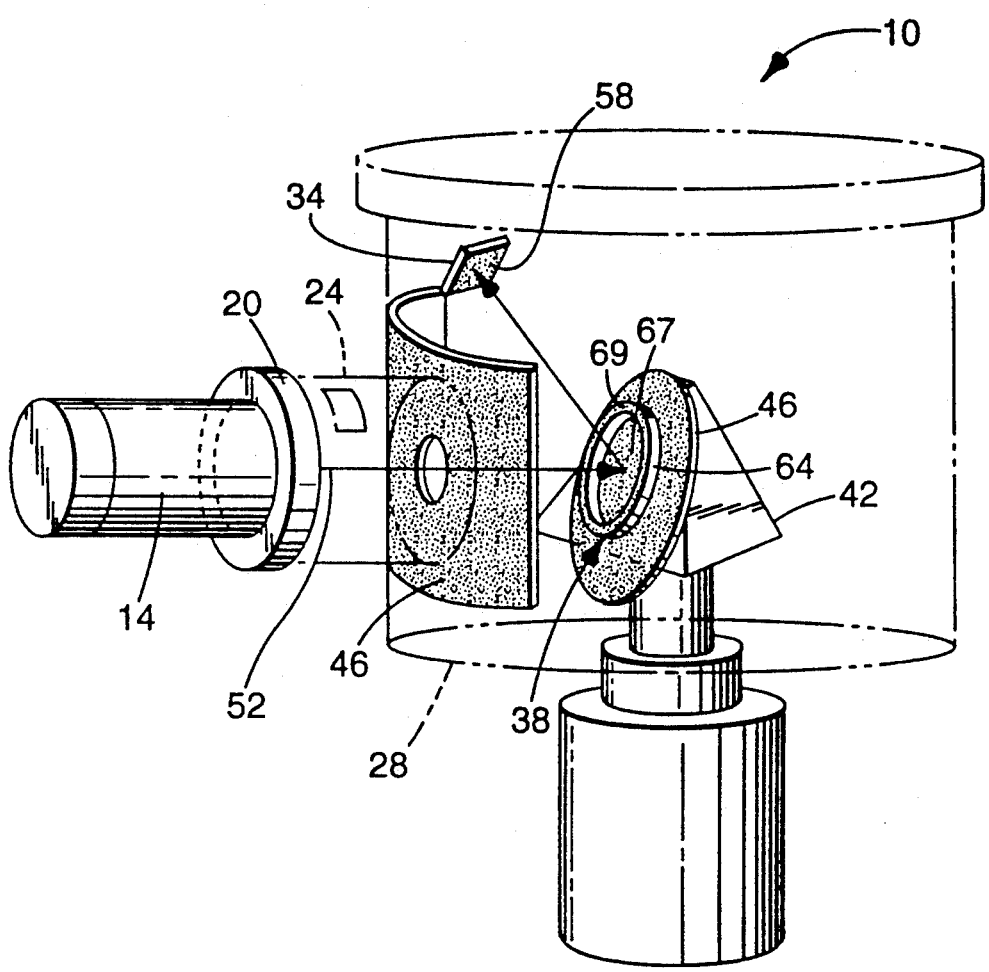
FIG. 1 is a representative schematic of a sputtering apparatus in which the target of this invention may be used.

FIG. 1 shows a representative ion beam deposition apparatus 10. Apparatus 10 preferably comprises ion gun 14, grids 20, hollow cathode neutralizer 24, chamber assembly 28, removable and replaceable substrate 34, sputtering target 38, and target support means such as table 42. Table 42 may comprise a water-cooled table. Optional shielding 46 may also be utilized according to the method of preparation and use described in this invention. Ion beam deposition apparatus 10 permits an ion beam 52 to be directed from a source toward target 38. The impact of ion beam 52 with target 38 results in the formation of a particulate flux which is deposited as a coating 58, preferably in the form of a thin film, on removable and replaceable substrate 34.

Figure 2:
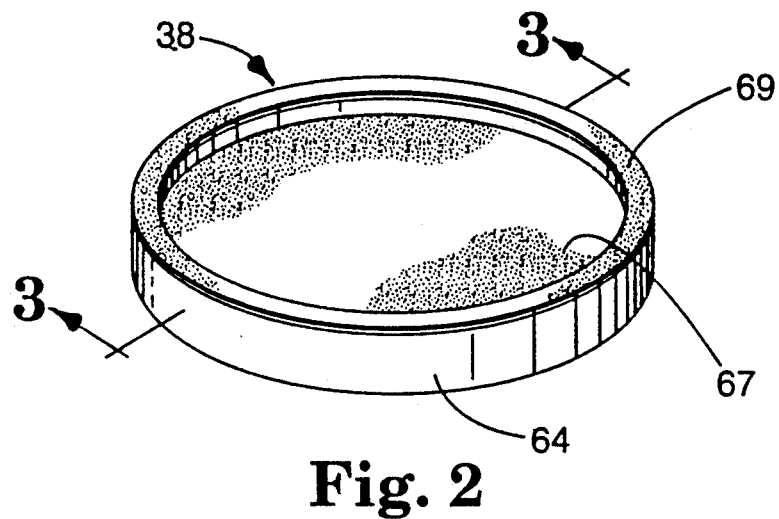
FIG. 2 is a perspective view of a target prepared by a method of this invention.
Figure 3:
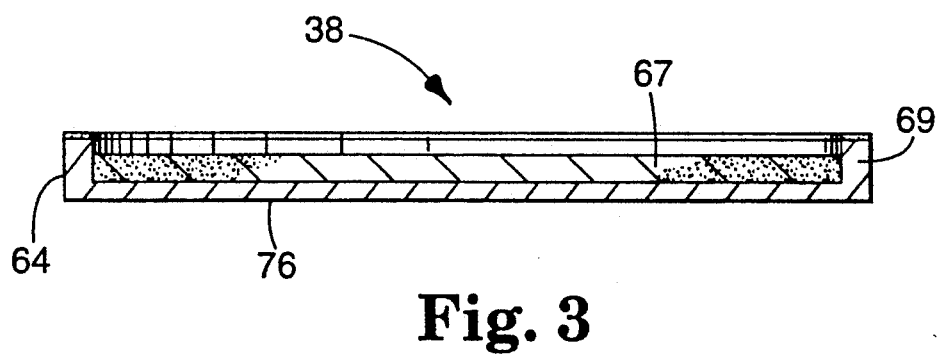
FIG. 3 is a cross-sectional view of a target illustrating the relationship of the target material with the target base and rim.

FIG. 2 and FIG. 3 each illustrate a representative deposition target 38 having a target base 64 (interchangeably referred to herein as a mold) and target material 67. Base 64 is often in a circular configuration, although it may also be formed in any other generally planar geometrical shape. Base 64 serves as a mold for forming and containing target material 67 during preparation and use. A thin rim 69 around target base 64 helps to define the periphery of target material 67, and may also be used to secure target material 67 to base 64 so that target 38 may be placed in deposition apparatus 10 without regard to angular orientation. Base plate 76 and thin rim 69 may, but need not have to, be fabricated from a single piece of material. Copper makes a good target base and rim material. Target 38 may be of various geometries and sizes, and other material may be appropriate, depending on the specifications and requirements of the deposition apparatus and materials.

Target material 67 is prepared for deposition by starting with a bulk supply of target material of the same or nearly the same composition which is to be deposited on a substrate. The target material is converted from either a block or granular form to a fine powder by any conventional means compatible with the target material itself. For some compositions, the formulation of the target material from its basic elements or compounds may result in the target material being provided already in a fine powder form, thus the process step of further grinding this material may not be necessary. For example, targets of MgO and ZrO2 are produced using standard purchased laboratory powders without a grinding step. In one embodiment disclosed, pellets of Bi-Sr-Ca-Cu-O are placed into an automatic mortar and pestle and mechanically ground into a fine powder. Typically, particle sizes ranged from 1 micron to 100 microns, although sizes of up to 1000 microns may be utilized.

Each of these fine powders is then mixed with just enough evaporable solvent to produce a slurry. In order to produce enough slurry to form solid target material 67 on a target base 64 having a diameter of 190 mm, with a desired final thickness of approximately 3 mm, about 75 cubic centimeters of the finely ground powder is mixed with approximately 50 cubic centimeters of high-purity isopropyl alcohol. Other high-purity evaporable solvents, or volatile suspending liquids, such as acetone, butyl acetate, heptane, methanol, isopropanol or water may be used as well. The preferred solvent may be chosen after appropriate considerations with regard to toxicity, flammability, environmental impact, cost of the selected solvent, and suitability, for the specific composition of the target material. Preferably the suspending liquid has a vapor pressure at room temperature at least as great as the vapor pressure of water.

After thoroughly mixing the powder and the solvent, the resultant slurry is poured onto target base 64, and spread to cover base 64 to an approximate uniform thickness. On some samples, a thin layer of solvent is spread on the base or mold surfaces before casting the slurry in order to promote uniformity of the slurry layer. If the resultant resistant to flowing, thin rim 69 may not be required to contain the slurry. However, thin rim 69 may be helpful as a means to retain target material 67 so that target 38 may be used in any angular orientation in the deposition apparatus.

The solvent portion of the slurry is then allowed to evaporate at or about room temperature. In at least one run, the solvent was allowed to evaporate slowly overnight. Slow drying at ambient temperature (i.e., normally at room temperature) is preferred, and indeed, may be essential for producing targets free of the problems described above. Slow drying of a slurry may occur over a long period of time, or it may be done by regulating the rate of evaporation of the suspending liquid. For the sample size described earlier, the slurry was allowed to dry for several hours, and was then ready for installation in the sputtering deposition apparatus.

Figure 4:
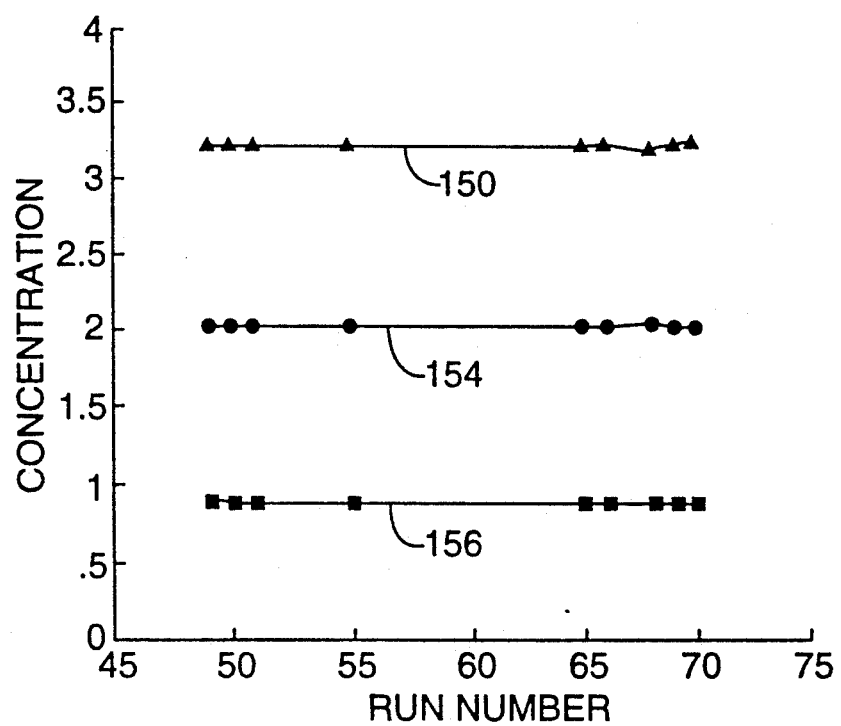
FIG. 4 is a graph demonstrating the uniformity of sputtering results obtainable by using targets prepared by a process of this invention over a large number of sputtering operations.

The method of manufacturing target material according to this invention produces unexpected results. By slowing down the drying process, it is actually possible to accelerate the process of producing high quality, compositionally consistent coatings. In particular, it is possible to obtain very consistent compositions from run to run with slurry targets and ion beam deposition. As shown in FIG. 4 and later in Example 1, the concentrations of compositions 150 (copper), 154 (barium), and 156 (yttrium) from one deposition run to the next are frequently identical, with as little as only 2% difference for 9 coatings performed over several months. The slow drying process produces a target with the desired material, with no binder, and with a smooth, uniform surface. Although thickness may vary, a thickness of between 1/16 and ⅛ inches (0.158–0.318 centimeters) is desirable.

In addition to the slurry slow drying process, the use of variably-sized powdered target material particles is considered important to a method of successful target material production. Previously, single isopressed oxide powder targets were used with ion beam deposition, and single dry powder targets were used with RF diode sputtering for production of certain films. However, powders consisting of mixed size particles usually produce better targets than do powders consisting of more uniformly sized particles. This is a further unexpected result of the novel processes described above. The novel processes permit the formation of unique targets which might not otherwise be formed by other means.

The slurry targets 38 produced according to the processes of this invention are mechanically quite stable. The target material remains firmly in the target molds at any orientation, even when inverted. Small scrapes or jolts do not cause catastrophic failure to target 38 in contrast with pressed powder targets. If scratched so that a small amount of material was removed, the remainder of target material 67 stays intact and the damaged area may be repaired by gentle packing with additional powder. If target 38 is damaged beyond simple repair, the powder is re-mixed with solvent, re-poured into the target mold, and left to dry. The slurry targets do not fail during chamber evacuation, again in contrast with the pressed powder targets. This is attributed to a reduction of residual gas pockets in the new slurry target 38.

The preparation of slurry target 38 requires significantly less material than a sturdy sintered target. The use of a slurry target obviates having to fire the target in the desired shape. Also, targets 38 do not crack during sputtering as do the sintered targets. A smaller furnace may be used to prepare the material for a slurry target than is required to fabricate a comparable diameter sintered target.

A further benefit of the slurry target is that it is vacuum compatible. There is no increase in the vacuum system pump-down time or in the base pressure of the chamber when a slurry target is used after overnight drying.

EXAMPLE 1

A powder target of composition $Y_{0.91}Ba_{2.13}Cu_{3.04}O_{x}$ prepared in accordance with one of the preferred methods described above is placed on a water-cooled target support table 42 in ion beam deposition apparatus 10. A vacuum pump (not shown) reduces the pressure inside apparatus 10 to a system base pressure of $1 \times 10^{-7}$ torr ($1.3 \times 10^{-8}$ kPa), reaching this value after approximately 8 hours of pumping. High-purity Argon gas is then admitted, under control of a gas flow regulator (not shown) to the interior of the apparatus until the desired deposition pressure of $1.4 \times 10^{-4}$ torr ($1.82 \times 10^{-5}$ kPa) is reached, with this pressure being maintained throughout the ensuing deposition process. A glass substrate 34 is located a distance L from the target, approximately in line with the central path of target material being ejected from target material 67 supported in target base 64. The ion beam comprises Argon ions with 1000 eV energy and beam current of about 200 milliamperes. A deposition rate of approximately 0.9 Angstroms/second (0.09 nanometer) is achieved under these conditions, and the deposited film thickness is about 1 micron ($1 \times 10^{-3}$ millimeters). Compositional analysis of the deposited film is performed using inductively coupled plasma emission spectroscopy and provides the result of $Y_{0.87}Ba_{2.00}Cu_{3.18}O_{x}$, which values correspond quite closely to the composition of the target material used in this example. The greater difference in copper composition between that in the target and that in the deposited film is a result of a characteristic of the sputtering process, and the amount of copper in the target is predetermined in order to achieve the desired amount of copper in the deposited film.

Over a period of several weeks, additional coatings are prepared from the same target and the target is removed from the deposition apparatus for periods of time when the deposition apparatus was used with targets of differing compositions. The numbers along the abscissa of FIG. 4 represent usage of the apparatus. The depositions from the target of composition $Y_{0.91}Ba_{2.13}Cu_{3.04}O_{x}$ are, for example, produced in the 49th, 50th, 51st, 55th, 65th, 66th, 68th, 69th, and 70th uses of the deposition apparatus. The data illustrated in FIG. 4 indicates the reusability of powder targets prepared by the processes of this target material invention in that the composition of the deposited material does not significantly vary as a result of a large number of uses or as a result of time delays between subsequent uses.

EXAMPLE 2

A powder target of composition $Bi_{2.00}Sr_{1.94}Ca_{0.74}Cu_{1.98}O_{x}$ prepared in accordance with one of the preferred methods described above is placed on a water-cooled target support table 42 in an ion-beam deposition apparatus 10 schematically illustrated in FIG. 1. The deposition conditions are as described in Example 1. Compositional analysis of the deposited film is performed using inductively coupled plasma emission spectroscopy and provides the result of $B_{2.00}Sr_{2.09}Ca_{0.74}Cu_{2.44}O_{x}$, which values, with the earlier-mentioned compositional adjustment for copper, also correspond quite closely to the composition of the target material used in this example.

EXAMPLE 3

A powder target of composition $Bi_{4.00}Sr_{2.90}Ca_{2.94}Cu_{4.10}O_{x}$ prepared in accordance with one of the preferred methods described above is placed on a water-cooled target support table 42 in an ion-beam deposition apparatus 10 schematically illustrated in FIG. 1. The deposition conditions are as described in Example 1. Compositional analysis of the deposited film is performed using inductively coupled plasma emission spectroscopy, and provides the result of $Bi_{4.00}Sr_{3.12}Ca_{3.03}Cu_{4.56}O_{x}$, which values also correspond quite closely to the composition of the target material used in this example, again noting the compositional adjustment for copper.

We claim:

1. A method of making a target for sputter deposition of a coating onto a substrate, comprising the steps of:
    a) providing a powdered target material;
    b) combining a suspending liquid with the target material to form a slurry;
    c) forming the slurry to a desired target shape; and
    d) drying the slurry by evaporating the suspending liquid at about room temperature.

2. A method according to claim 1 wherein said powdered target material comprises powdered target material of mixed particle sizes.

3. A method according to claim 2 wherein said particle sizes range up to about 1 mm in diameter.

4. A method according to claim 2 wherein said particle sizes range from about 100 μm to about 1 mm in diameter.

5. A sputter target comprising the product made by the method of claim 2.

6. A method according to claim 1 wherein said suspending liquid is selected from the group consisting of acetone, butyl acetate, heptane, methanol, isopropanol and water.

7. A method according to claim 1 wherein said temperature is regulated to produce a substantially uniform, crack-free target surface.

8. A sputter target comprising the product made by the method of claim 1.

9. A method of sputter depositing a coating on a substrate with a uniform composition, said method comprising the steps of:

a) providing a powdered target material;
b) combining a suspending liquid with the target material to form a slurry;
c) forming the slurry to a desired target shape;
d) drying the slurry by evaporating the suspending liquid at about room temperature; and
e) sputter depositing the target material onto said substrate.

* * * * *